US011854442B2

(12) United States Patent
Yoon

(10) Patent No.: US 11,854,442 B2
(45) Date of Patent: Dec. 26, 2023

(54) COVER WINDOW AND DISPLAY DEVICE INCLUDING THE SAME

(71) Applicant: Samsung Display Co., Ltd., Yongin-si (KR)

(72) Inventor: Byungseo Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/967,246

(22) Filed: Oct. 17, 2022

(65) Prior Publication Data
US 2023/0237936 A1 Jul. 27, 2023

(30) Foreign Application Priority Data
Jan. 25, 2022 (KR) .................. 10-2022-0011043

(51) Int. Cl.
G06F 3/041 (2006.01)
G09F 9/30 (2006.01)
G02B 1/14 (2015.01)
H05K 5/03 (2006.01)
G06F 1/16 (2006.01)
H10K 50/844 (2023.01)
H10K 59/40 (2023.01)

(52) U.S. Cl.
CPC ............... G09F 9/301 (2013.01); G02B 1/14 (2015.01); G06F 1/1652 (2013.01); H05K 5/03 (2013.01); H10K 50/844 (2023.02); H10K 59/40 (2023.02)

(58) Field of Classification Search
CPC ......... G09F 9/301; G06F 1/1652; G02B 1/14; H05K 5/03; H10K 20/844; H10K 59/40; H04M 1/0268
See application file for complete search history.

(56) References Cited

U.S. PATENT DOCUMENTS

2020/0324521 A1* 10/2020 Park .................. B32B 17/10146
2020/0329575 A1 10/2020 Park et al.
2020/0342789 A1* 10/2020 Park ........................ G09F 9/301
2020/0392038 A1 12/2020 Park et al.
2021/0107826 A1 4/2021 Hwang et al.
2021/0282285 A1* 9/2021 Sunwoo .................. B32B 17/06
2022/0079161 A1* 3/2022 Sunwoo .................... A01P 1/00
(Continued)

FOREIGN PATENT DOCUMENTS

KR 1020170122554 A 11/2017
KR 102111138 B1 5/2020
(Continued)

Primary Examiner — Joe H Cheng
(74) Attorney, Agent, or Firm — CANTOR COLBURN LLP

(57) ABSTRACT

A cover window includes glass including a folding portion of a folding area, a planar portion, and a boundary portion between the folding portion and the planar portion, the boundary portion having a thickness that gradually becomes greater than a thickness of the folding portion as farther from the folding portion and having inclination with respect to the planar portion, and a filler disposed on a first surface of the glass. The inclination is an acute angle defined when a virtual line which is parallel to the planar portion and meets the folding portion meets the boundary portion, and is less than about 1°. A difference between a refractive index of the filler and a refractive index of the glass is within about 0.07.

20 Claims, 17 Drawing Sheets

(56) References Cited

U.S. PATENT DOCUMENTS

2022/0195235 A1\* 6/2022 Sunwoo .............. C08F 290/067
2022/0267194 A1 8/2022 Jeong et al.

FOREIGN PATENT DOCUMENTS

| KR | 102150390 B1 | | 9/2020 |
|---|---|---|---|
| KR | 102150391 B1 | | 9/2020 |
| KR | 102150392 B1 | | 9/2020 |
| KR | 102272926 B1 | * | 7/2021 |
| KR | 102272926 B1 | | 7/2021 |
| KR | 1020220120781 A | | 8/2022 |

\* cited by examiner

FIG. 10B

| θb1(°)<br>L(mm) | 15 | 30 | 45 | 60 |
|---|---|---|---|---|
| 300 | 5.3 | 9.8 | 13.1 | 14.9 |
| 350 | 4.3 | 8.1 | 10.9 | 12.6 |
| 400 | 3.7 | 6.9 | 9.4 | 10.9 |
| 450 | 3.2 | 6.0 | 8.2 | 9.6 |
| 500 | 2.8 | 5.3 | 7.3 | 8.6 |

| θa2(°) θb1(°) L(mm) | 15 | 30 | 45 | 60 |
|---|---|---|---|---|
| 300 | 3.1 | 6.2 | 9.0 | 11.5 |
| 350 | 2.8 | 5.4 | 7.9 | 10.1 |
| 400 | 2.5 | 4.9 | 7.1 | 8.9 |
| 450 | 2.2 | 4.4 | 6.4 | 8.0 |
| 500 | 2.1 | 4.0 | 5.8 | 7.3 |

FIG. 11B

| θb2(°) / θR(°) | 0 | 15 | 30 | 45 | 60 |
|---|---|---|---|---|---|
| 0 | 0.0 | 0.0 | 0.0 | 0.0 | 0.0 |
| 0.2 | 0.6 | 0.6 | 0.7 | 0.8 | 1.0 |
| 0.4 | 1.2 | 1.2 | 1.3 | 1.5 | 2.0 |
| 0.6 | 1.8 | 1.8 | 2.0 | 2.3 | 3.1 |
| 0.8 | 2.4 | 2.5 | 2.6 | 3.1 | 4.1 |
| 0.9 | 2.7 | 2.8 | 3.0 | 3.4 | 4.7 |
| 1 | 3.0 | 3.1 | 3.3 | 3.8 | 5.3 |
| 1.2 | 3.6 | 3.7 | 4.0 | 4.6 | 6.4 |
| 1.4 | 4.2 | 4.3 | 4.6 | 5.4 | 7.6 |
| 1.6 | 4.8 | 4.9 | 5.3 | 6.2 | 8.9 |
| 1.8 | 5.4 | 5.6 | 6.0 | 7.1 | 10.3 |

| Θb2(°)<br>L(mm) | 30 | 45 | 60 | |
|---|---|---|---|---|
| 300 | 13.2 | 11.0 | 8.0 | |
| 350 | 11.3 | 9.4 | 6.8 | |
| 400 | 9.9 | 8.2 | 5.9 | —J |
| 450 | 8.8 | 7.3 | 5.2 | |
| 500 | 7.9 | 6.5 | 4.7 | |

COVER WINDOW AND DISPLAY DEVICE INCLUDING THE SAME

This application claims priority to Korean Patent Application No. 10-2022-0011043, filed on Jan. 25, 2022, and all the benefits accruing therefrom under 35 U.S.C. § 119, the content of which in its entirety is herein incorporated by reference.

BACKGROUND

1. Field

Embodiments relate to a cover window and a display device including the same.

2. Description of the Related Art

A display visually displays data. The display device is used as the display of a small product such as a mobile phone or is used as the display of a large product such as a television.

As the use of the display device is being diversified in recent years, various designs for improving the quality and function of the display device are being attempted. Recently, flexible display panels such as a foldable display panel and a rollable display panel that may be rolled into a roll shape are being developed.

SUMMARY

Embodiments include a cover window having folding portion slimming visibility improved by adjusting an angle of a folding portion slimming shape of a foldable display and a refractive index of a filler, and a display device having the cover window. However, such a technical problem is an example, and the invention is not limited thereto.

Additional features will be set forth in part in the description which follows and, in part, will be apparent from the description, or may be learned by practice of the embodiments of the invention.

According to an embodiment of the invention, a cover window includes glass including a folding portion of a folding area, a planar portion, and a boundary portion between the folding portion and the planar portion, the boundary portion having a thickness that gradually becomes greater than a thickness of the folding portion as farther from the folding portion and having inclination with respect to the planar portion, and a filler disposed on a first surface of the glass. The inclination is an acute angle defined when a virtual line which is parallel to the planar portion and meets the folding portion meets the boundary portion, and is less than about 1°. A difference between a refractive index of the filler and a refractive index of the glass is within about 0.07.

In an embodiment, surface reflection may occur due to light incident on a second surface of the glass opposite to the first surface of the glass. Interfacial reflection may occur at a portion where the glass and a surface of the filler facing the glass meet each other. The filler may have the refractive index at which the interfacial reflection is within about 2% of the surface reflection.

In an embodiment, the cover window may further include a polarization plate on a first surface of the filler opposite to a second surface of the filler facing the glass. The filler may include a pressure-sensitive adhesive ("PSA").

In an embodiment, the glass may include ultra-thin glass ("UTG") and may have the refractive index of about 1.5 to about 1.52.

In an embodiment, the cover window may further include a polarization plate on a first surface of the filler opposite to a second surface of the filler facing the glass. The filler may include an ultraviolet ("UV") curable adhesive (e.g., optically clear resin ("OCR")).

In an embodiment, the folding portion, the boundary portion, and the planar portion may be symmetrical with respect to a center of the folding portion.

In an embodiment, the folding portion may have a uniform thickness.

In an embodiment, the glass may further include a second surface opposite to the first surface of the glass, and the folding portion may be provided in at least one of the first and second surfaces of the glass.

In an embodiment, the filler disposed on at least one of the first and second surfaces of the folding portion of the glass may include a same material.

According to an embodiment of the invention, a display device includes a lower cover, a display panel disposed on the lower cover, and a cover window disposed on the display panel and including glass and a filler. The glass includes a folding portion of a folding area, a planar portion, and a boundary portion between the folding portion and the planar portion, the boundary portion having a thickness that gradually becomes greater than a thickness of the folding portion and having inclination with respect to the planar portion, and the filler is filled between the planar portion, the folding portion, and the boundary portion and in a first surface of the glass. The boundary portion has the folding portion gradually thickening therefrom as farther from the folding portion and has the inclination. The inclination is an acute angle defined when a virtual line which is parallel to the planar portion and meets the folding portion meets the boundary portion, and is less than about 1°. A difference between a refractive index of the filler and a refractive index of the glass is within about 0.07.

In an embodiment, the glass further may include a second surface opposite to the first surface of the glass and surface reflection may occur due to light incident on the second surface of the glass. Interfacial reflection may occur at a portion where the glass and an upper surface of the filler meet each other. The filler may have the refractive index at which the interfacial reflection is within about 2% of the surface reflection.

In an embodiment, the cover window may further include a polarization plate on a first surface of the filler opposite to a second surface of the filler facing the glass. The filler may include a pressure-sensitive adhesive ("PSA").

In an embodiment, the glass may include UTG and may have the refractive index of about 1.5 to about 1.52.

In an embodiment, the cover window may further include a polarization plate on a first surface of the filler opposite to a second surface of the filler facing the glass. The filler may include a UV curable adhesive (e.g., OCR).

In an embodiment, the folding portion, the boundary portion, and the planar portion may be symmetrical with respect to a center of the folding portion.

In an embodiment, the folding portion may have a uniform thickness.

In an embodiment, the glass may further include a second surface opposite to the first surface of the glass and the folding portion may be provided in at least one of the first and second surfaces of the glass.

In an embodiment, the filler disposed on at least one of the first and second surfaces of the folding portion may include a same material.

BRIEF DESCRIPTION OF THE DRAWINGS

The above and other features and advantages of embodiments of the invention will be more apparent from the following description taken in conjunction with the accompanying drawings, in which:

FIGS. 10B and 10C are tables showing a first viewing angle and a second viewing angle according to a screen angle and a viewing distance;

FIGS. 11B and 11C are tables showing a path change angle according to inclination or a viewing distance and a screen angle.

DETAILED DESCRIPTION

Figure 1:
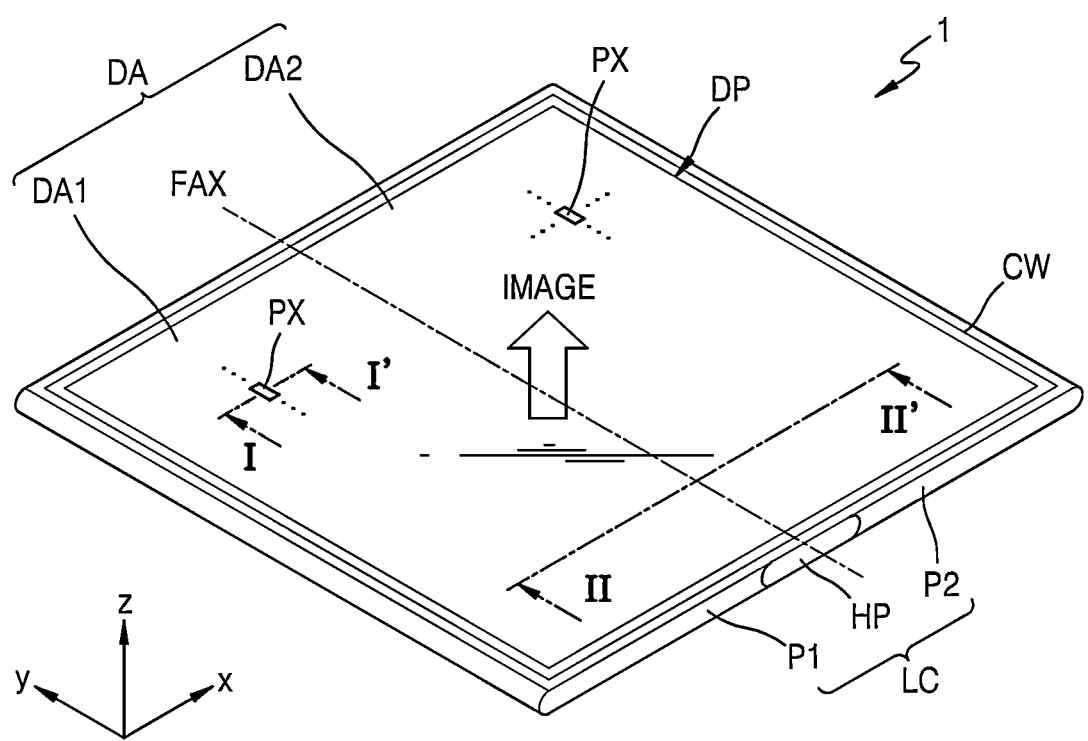
FIGS. 1 and 2 are schematic perspective views of an embodiment of a display device.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Effects and features of embodiments and methods of accomplishing the same will become apparent from the following detailed description of the embodiments, taken in conjunction with the accompanying drawings. However, the embodiments may have different forms and should not be construed as being limited to the descriptions set forth herein. Rather, these embodiments are provided so that this disclosure will be thorough and complete and will fully convey the scope defined by the appended claims to those skilled in the art.

Shapes, sizes, ratios, angles, numbers, and the like disclosed in the drawings for describing embodiments of the disclosure are merely some of embodiments, and thus, the invention is not limited to the illustrated details. Like reference numerals refer to like elements throughout. In the present description, certain detailed explanations of the related art are omitted when it is deemed that they may unnecessarily obscure the essence of the disclosure. The terms "include," "comprise," and "have" as used herein may be intended to indicate a plurality of components unless the terms are used with the term "~ only." The singular forms "a," "an," and "the" as used herein are intended to include the plural forms as well unless explicitly stated otherwise.

In describing a position relationship between elements, for example, when a position relationship between two portions is described with the terms "on ~," "above ~," "below ~," "next to ~," or the like, one or more other portions may be disposed between the two portions unless the term "right" or "directly" is explicitly used.

While such terms as "first" and "second" may be used to describe various elements, such elements must not be limited to the above terms. The above terms are used only to distinguish one element from another. Accordingly, an element designated as a first element could be termed as a second element without departing from the scope of embodiments.

Since sizes of elements in the drawings may be exaggerated or reduced for convenience of explanation, the invention is not limited thereto.

Features of various embodiments of the disclosure may be partially or entirely bound or combined with each other, and be technically engaged and driven using various methods as apparent to those skilled in the art, and the embodiments may be independently practiced alone or in combination.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Reference will now be made in detail to embodiments, embodiments of which are illustrated in the accompanying drawings.

Figure 2:
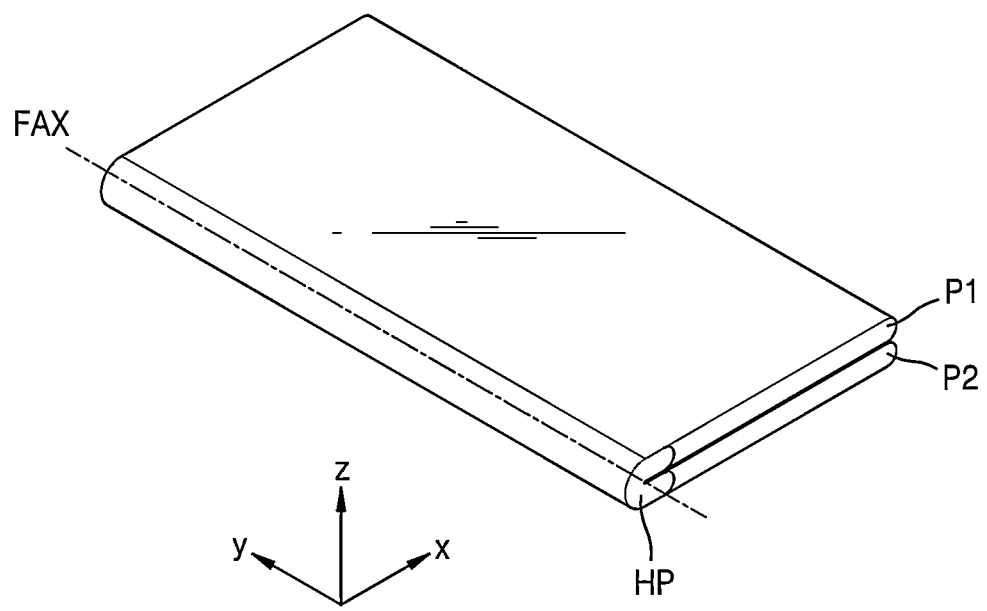

FIGS. 1 and 2 are schematic perspective views of an embodiment of a portion of a display device 1. FIG. 1 shows an unfolded state of the display device 1, and FIG. 2 shows a folded state of the display device 1.

Referring to FIGS. 1 and 2, the display device 1 may include a lower cover LC, a display panel DP, and a cover window CW.

The lower cover LC may include a first portion P1 and a second portion P2 supporting the display panel DP. The lower cover LC may be folded around a folding axis FAX defined between the first portion P1 and the second portion P2. In an embodiment, the lower cover LC may further include a hinge portion HP, and the hinge portion HP may be between the first portion P1 and the second portion P2.

The display panel DP may include a display area DA. The display panel DP may provide an image through an array of a plurality of pixels PX arranged in the display area DA.

Each of the plurality of pixels PX may be defined as an emission area where light is emitted by a light-emitting element electrically connected to a pixel circuit. In an embodiment, each pixel PX may emit red, green, or blue light. In an alternative embodiment, each pixel PX may emit red, green, blue, or white light.

The light-emitting element included in the display panel DP may include an organic light-emitting diode, an inorganic light-emitting diode, a micro light-emitting diode and/or a quantum-dot light-emitting diode. While a case where the light-emitting element included in the display panel DP includes an organic light-emitting diode is mainly described below for convenience, the following description is not limited thereto, and the same may be applied even when other types of light-emitting elements are provided.

The display area DA may include a first display area DA1 and a second display area DA2 arranged on opposite sides of the folding axis FAX crossing the display area DA. The first display area DA1 and the second display area DA2 may be arranged over the first portion P1 and the second portion P2 of the lower cover LC, respectively. The display panel DP may provide a first image and a second image by light emitted from the plurality of pixels PX arranged in the first display area DA1 and the second display area DA2. In an embodiment, the first image and the second image may be portions of an image provided through the display area DA of the display panel DP. In another embodiment, the display panel DP may provide a first image and a second image independent of each other.

The display panel DP may be folded around the folding axis FAX. When the display panel DP is folded, the first display area DA1 and the second display area DA2 of the display panel DP may face each other.

Although FIGS. 1 and 2 show the folding axis FAX extending in a direction y, the invention is not limited thereto. In an embodiment, the folding axis FAX may extend in a direction x crossing the direction y. In an alternative embodiment, in the xy plane, the folding axis FAX may extend in a direction crossing the direction x and the direction y.

In addition, FIGS. 1 and 2 show one folding axis FAX, but the invention is not limited thereto. In an embodiment, the display panel DP may be folded a plurality of times around a plurality of folding axes FAX crossing the display area DA.

The cover window CW may be disposed on the display panel DP to cover the display panel DP. The cover window CW may be folded or bent according to an external force without the occurrence of cracks or the like. When the display panel DP is folded around the folding axis FAX, the cover window CW may also be also folded.

Figure 3:
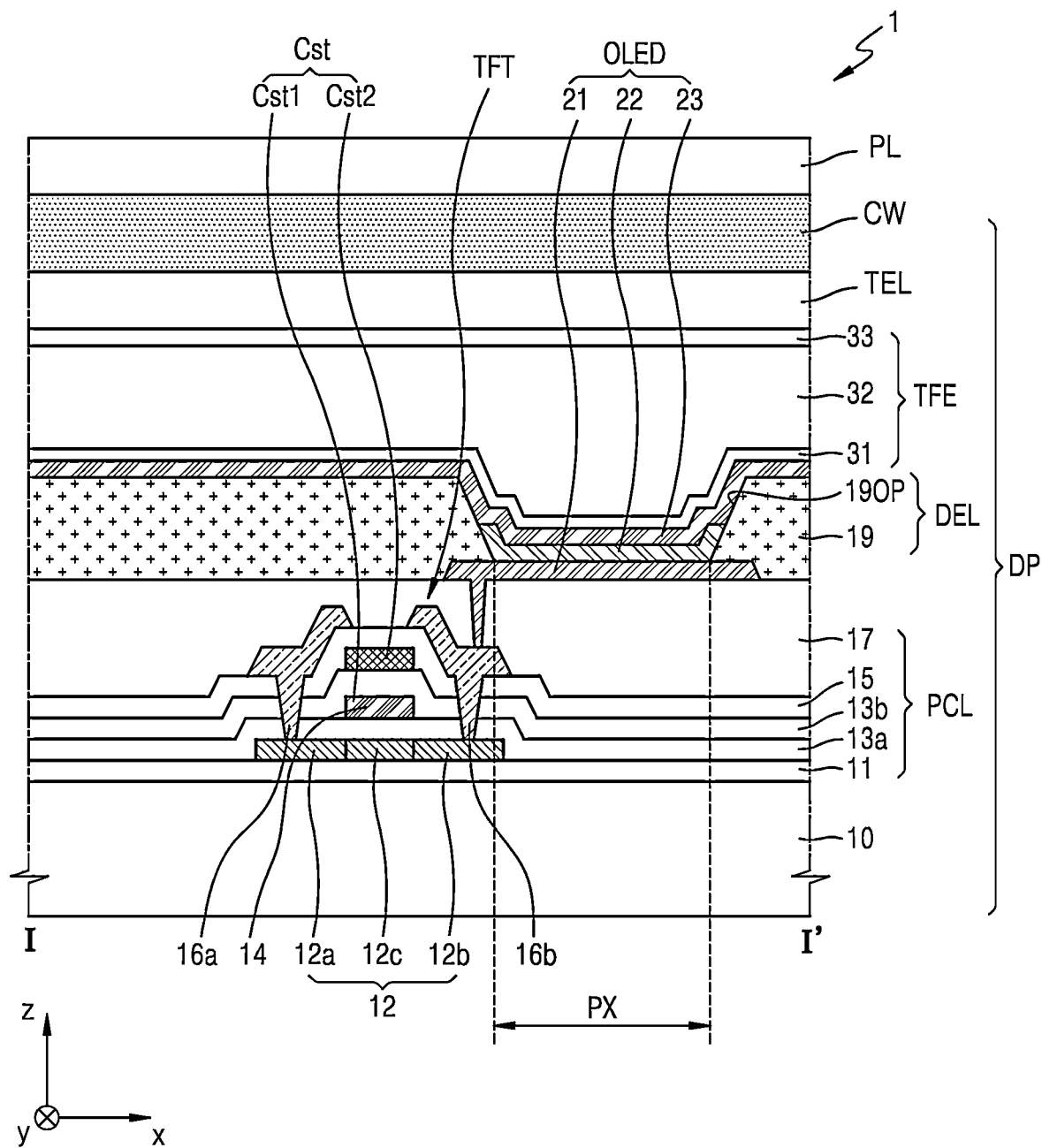
FIG. 3 is a schematic cross-sectional view of an embodiment of a portion of a display device.

FIG. 3 is a schematic cross-sectional view of an embodiment of a portion of the display device 1. FIG. 3 may correspond to cross-sectional views of the display device 1, taken along line I-I' of FIG. 1.

Referring to FIG. 3, the display panel DP may include a stacked structure of a substrate 10, a pixel circuit layer PCL, a display element layer DEL, a thin film encapsulation layer TFE, and a touch electrode layer TEL.

The substrate 10 may include glass or polymer resin. In an embodiment, the polymer resin may include at least one of polyethersulfone, polyarylate, polyetherimide, polyethylene naphthalate, polyethylene terephthalate, polyphenylene sulfide, polyimide, polycarbonate, cellulose triacetate, cellulose acetate propionate, etc.

The pixel circuit layer PCL may be disposed on the substrate 10. FIG. 3 shows the pixel circuit layer PCL including a thin-film transistor TFT and a buffer layer 11, a first insulating layer 13a, a second insulating layer 13b, a third insulating layer 15, and a planarization layer 17 disposed under and/or on elements of the thin-film transistor TFT.

The buffer layer 11 may reduce or prevent penetration of foreign materials, moisture, or external air from below the substrate 10 and may provide a flat surface on the substrate 10. In an embodiment, the buffer layer 11 may include an inorganic insulating material such as silicon nitride, silicon oxynitride, and silicon oxide, and may have a single-layer or multi-layer structure including the above-described inorganic insulating material.

The thin-film transistor TFT on the buffer layer 11 may include a semiconductor layer 12, and the semiconductor layer 12 may include polysilicon. In an alternative embodiment, the semiconductor layer 12 may include amorphous silicon, may include an oxide semiconductor, or may include an organic semiconductor, etc. The semiconductor layer 12 may include a channel region 12c, and a drain region 12a and a source region 12b respectively arranged on opposite sides of the channel region 12c. A gate electrode 14 may overlap the channel region 12c.

The gate electrode 14 may include a low-resistance metal material. In an embodiment, the gate electrode 14 may include a conductive material including molybdenum (Mo), aluminum (Al), copper (Cu), titanium (Ti), etc., and may have a multi-layer or single-layer structure including the above-described material.

The first insulating layer 13a may be between the semiconductor layer 12 and the gate electrode 14. In an embodiment, the first insulating layer 13a may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second insulating layer 13b may cover the gate electrode 14. In an embodiment, the second insulating layer 13b may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode Cst2 of a storage capacitor Cst may be disposed on the second insulating layer 13b. The upper electrode Cst2 may at least partially overlap the gate electrode 14 disposed therebelow. The gate electrode 14 and the upper electrode Cst2 overlapping each other with the second insulating layer 13b therebetween may constitute the storage capacitor Cst. That is, the gate electrode 14 may serve as a lower electrode Cst1 of the storage capacitor Cst.

As described above, the storage capacitor Cst and the thin-film transistor TFT may overlap each other. In an alternative embodiment, the storage capacitor Cst may not overlap the thin-film transistor TFT. That is, the lower electrode Cst1 of the storage capacitor Cst may be spaced apart from the gate electrode 14 as an element separated from the gate electrode 14.

In an embodiment, the upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu) and may have a single-layer or multi-layer structure of the above-described material.

The third insulating layer 15 may cover the upper electrode Cst2. In an embodiment, the third insulating layer 15 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The third insulating layer 15 may have a single-layer or multi-layer structure including the above-described inorganic insulating material.

A drain electrode 16a and a source electrode 16b may each be arranged on the third insulating layer 15. The drain electrode 16a and the source electrode 16b may be respectively connected to the drain region 12a and the source region 12b through contact holes of the insulating layers below the drain electrode 16a and the source electrode 16b. The drain electrode 16a and the source electrode 16b may include a highly conductive material. In an embodiment, the drain electrode 16a and the source electrode 16b may include a conductive material including molybdenum (Mo), aluminum (Al), copper (Cu), titanium (Ti), etc., and may have a multi-layer or single-layer structure. In an embodiment, the drain electrode 16a and the source electrode 16b may have a multi-layer structure of titanium (Ti)/aluminum (Al)/titanium (Ti).

The planarization layer 17 may include an organic insulating material. In an embodiment, the planarization layer 17 may include an organic insulating material such as a general commercial polymer such as polymethylmethacrylate ("PMMA") or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and any combinations thereof.

The display element layer DEL may be disposed on the pixel circuit layer PCL having the above-described structure. The display element layer DEL may include an organic light-emitting diode OLED, which is a light-emitting element, and the organic light-emitting diode OLED may include a stacked structure of a first electrode 21, an emission layer 22, and a second electrode 23. The first electrode 21 of the organic light-emitting diode OLED may be electrically connected to the thin-film transistor TFT through a contact hole defined in the planarization layer 17.

In an embodiment, the first electrode 21 may include conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, the first electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or any combinations thereof. In an alternative embodiment, the first electrode 21 may further include a film on/under the above-described reflective film and including ITO, IZO, ZnO, or $In_2O_3$.

A pixel-defining layer 19 in which an opening 19OP exposing at least a portion of the first electrode 21 is defined may be disposed on the first electrode 21. The pixel-defining layer 19 may include an organic insulating material and/or an inorganic insulating material. The opening 19OP may define an emission area of light emitted from the organic light-emitting diode OLED. In an embodiment, a size/width of the opening 19OP may correspond to a size/width of the emission area, for example. Accordingly, a size and/or width of the pixel PX may depend on a size and/or width of the opening 19OP of the corresponding pixel-defining layer 19.

The emission layer 22 may be arranged in the opening 19OP of the pixel-defining layer 19. The emission layer 22 may include a polymer organic material or low-molecular weight organic material emitting light of a predetermined color. In an alternative embodiment, the emission layer 22 may include an inorganic light-emitting material or may include quantum dots.

Although not shown in FIG. 3, a first functional layer and a second functional layer may be respectively disposed under and on the emission layer 22. The first functional layer may include a hole transport layer ("HTL"), or an HTL and a hole injection layer ("HIL"), for example. The second functional layer may include an electron transport layer ("ETL") and/or an electron injection layer ("EIL"). However, the invention is not limited thereto. The first functional layer and the second functional layer may be selectively disposed on and under the emission layer 22, respectively.

The first functional layer and/or the second functional layer may be a common layer covering an entirety of the substrate 10 like the second electrode 23 described below.

The second electrode 23 may be disposed above the first electrode 21 and may overlap the first electrode 21. The second electrode 23 may include a conductive material having a low work function. In an embodiment, the second electrode 23 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an alternative embodiment, the second electrode 23 may further include a layer, such as ITO, IZO, ZnO, or $In_2O_3$, on a (semi)transparent layer including the above-described material. The second electrode 23 may be formed or provided as one body covering an entirety of the substrate 10.

An encapsulation member may be disposed on the display element layer DEL. In an embodiment, the encapsulation member may include the thin film encapsulation layer TFE. The thin film encapsulation layer TFE may be disposed on the display element layer DEL and may cover the display element layer DEL. The thin film encapsulation layer TFE may include at least one inorganic encapsulation layer and at least one organic encapsulation layer. In an embodiment, the thin film encapsulation layer TFE may include a first inorganic encapsulation layer 31, an organic encapsulation layer 32, and a second inorganic encapsulation layer 33 sequentially stacked on one another. In another embodiment, the encapsulation member may include an encapsulation substrate.

In an embodiment, the first inorganic encapsulation layer 31 and the second inorganic encapsulation layer 33 may include one or more inorganic materials among aluminum oxide, titanium oxide, tantalum oxide, hafnium oxide, zinc oxide, silicon oxide, silicon nitride, and silicon oxynitride. The organic encapsulation layer 32 may include a polymer-based material. In an embodiment, the polymer-based material may include acryl-based resin, epoxy-based resin, polyimide, and polyethylene. In an embodiment, the organic encapsulation layer 32 may include acrylate. The organic encapsulation layer 32 may be formed by curing a monomer or applying a polymer.

The touch electrode layer TEL including touch electrodes may be disposed on the thin film encapsulation layer TFE. The touch electrode layer TEL may obtain an external input, e.g., coordinate information according to a touch event.

The cover window CW may be disposed on the display panel DP. The cover window CW may adhere to the display panel DP via an adhesive member. In an embodiment, the adhesive member may be a pressure-sensitive adhesive ("PSA"), for example.

The cover window CW may have high transmittance to transmit light emitted from the display panel DP. In an embodiment, transmittance of the cover window CW may be 85% or greater and transmission haze may be 2% or less, but the invention is not limited thereto.

The cover window CW may have a small thickness to reduce a weight of the display device 1, and may have strong strength and hardness to protect the display panel DP from external impact.

In an embodiment, as shown in FIG. 3, a protection layer PL may be disposed on the cover window CW. The protection layer PL may cover the cover window CW and protect the cover window CW. In an embodiment, the protection layer PL may include one or more groups of transparent synthetic resin selected from polyethylene terephthalate ("PET"), polypropylene ("PP"), polystyrene ("PS"), polyimide ("PI"), etc., and may include a hard coating layer. In addition, an adhesive member, e.g., a pressure-sensitive adhesive ("PSA"), may be disposed between the protection layer PL and the cover window CW. In another embodiment, the protection layer PL may be omitted. In this case, an outermost surface of the display device 1 may include the cover window CW, thereby improving glass texture.

Figure 4:
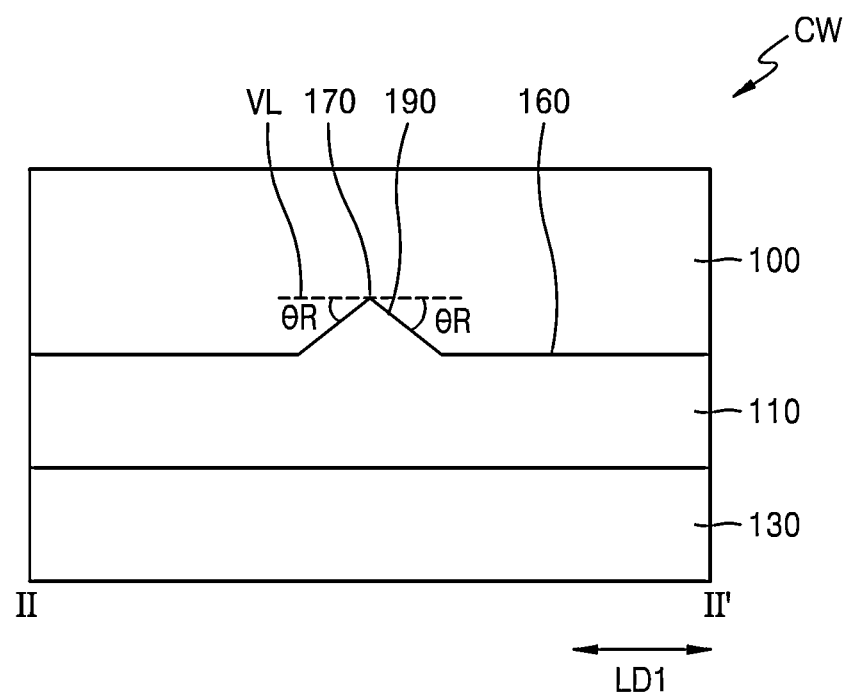
FIGS. 4 to 6 are schematic cross-sectional views of an embodiment of a portion of a cover window.
Figure 5:
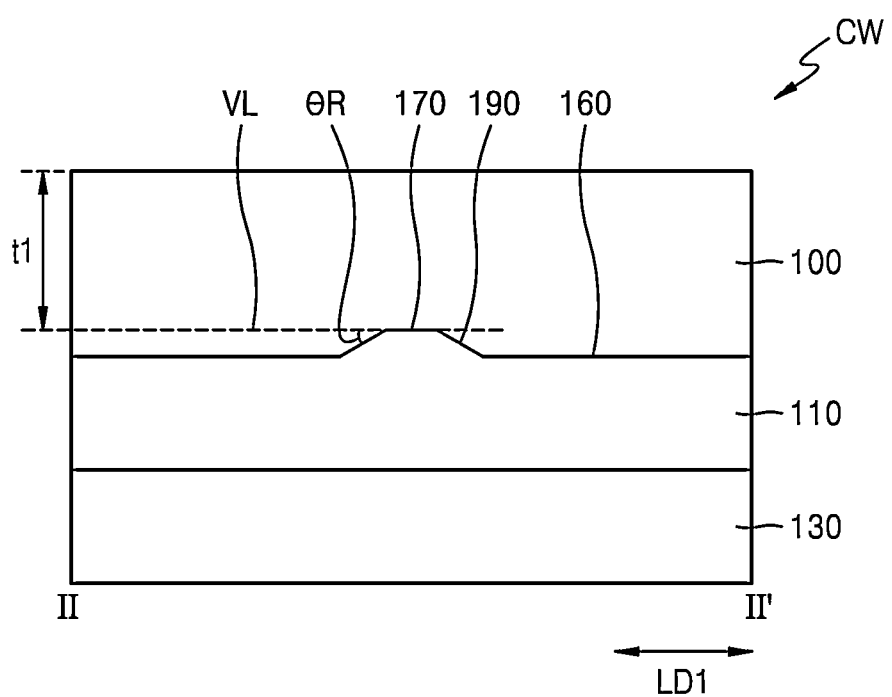
Figure 6:
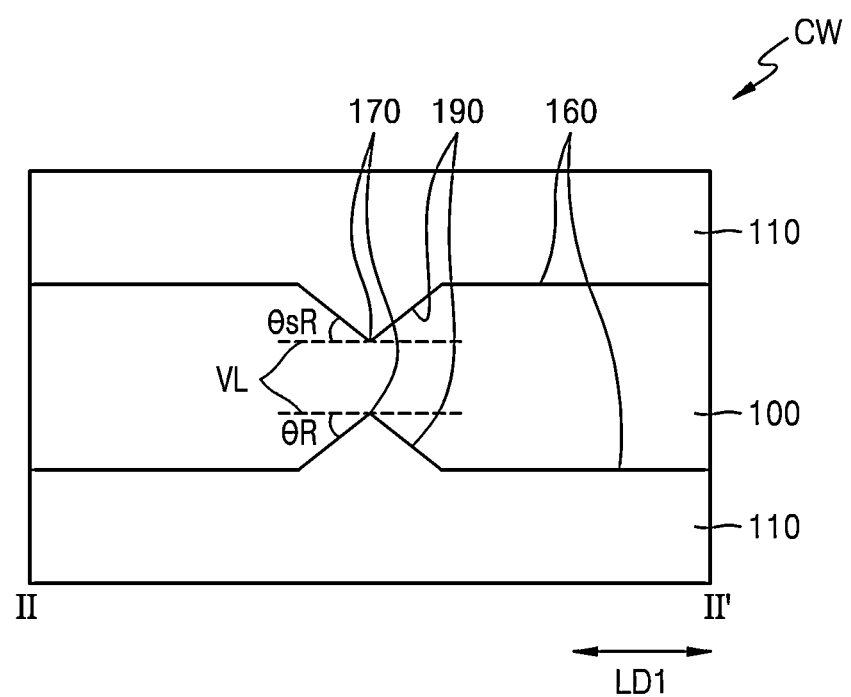

FIGS. 4 to 6 are schematic cross-sectional views of an embodiment of a portion of the cover window CW. FIGS. 4 to 6 may correspond to cross-sectional views of the display device 1, taken along line II-II' of FIG. 1.

Referring to FIGS. 4 to 6, the cover window CW may include at least one sheet of glass 100, a filler 110 disposed on one surface of the glass 100, and a polarization plate 130 disposed on a lower surface of the filler 110. In an embodiment, the filler 110 may fill a recessed portion of the one surface of the glass 100.

The glass 100 may include a folding portion 170 of a folding area, a boundary portion 190 in which the folding portion 170 gradually thickens and which has inclination ΘR, and a planar portion 160 other than the folding portion 170 and the boundary portion 190. When light is incident, panel reflection and refraction may occur between the atmosphere and the glass 100, and interfacial reflection may occur between the glass 100 and the filler 110. A slimming portion of the cover window CW may be visible due to interfacial reflection, and to prevent this, the inclination ΘR between the folding portion 170 and the boundary portion 190 may be less than about 1°.

The glass 100 may include glass or plastic. In an embodiment, the glass 100 may be, but is not limited to, ultra-thin glass ("UTG") toughened by a method such as chemical tempering or thermal tempering. When the glass 100 is UTG, the glass 100 may have a refractive index of about 1.5 to about 1.52.

The glass 100 may be partially slimmed. Partial slimming means making a portion of a folding area of the glass 100 thinner than other areas. Accordingly, the glass 100 may include the folding portion 170 of the folding area, the boundary portion 190 in which the folding portion 170 gradually thickens and which has inclination ΘR, and the planar portion 160 which is an area other than the folding portion 170 and the boundary portion 190. The inclination ΘR may be a smaller angle of two angles defined when a virtual line VL extending in a first direction LD1 described below and the boundary portion 190 meet each other.

In an embodiment, the folding portion 170, the boundary portion 190 and/or the planar portion 160 may be symmetrical in the first direction LD1 with respect to a center of the folding portion 170. In this case, sizes or shapes of the first portion P1 and the second portion P2 of the display device 1 may be the same as each other with respect to the hinge portion HP.

The inclination ΘR may be a smaller angle of two angles defined when the virtual line VL extending in the first direction LD1 and meeting the folding portion 170 meets the boundary portion 190. The first direction LD1 may be parallel to the planar portion 160. The virtual line VL extending in the first direction LD1 may be a line parallel to the planar portion 160. The inclination ΘR is a degree to which the planar portion 160 is inclined, and the inclination ΘR may be an acute angle (less than 180°). That is, the inclination ΘR may be an angle obtained by subtracting an angle defined when the boundary portion 190 and the planar portion 160 meet each other from 180°. The inclination ΘR may be less than about 1°. Thus, when incident light through the glass 100 meets the filler 110, and interfacial reflection occurs, an area of a partially slimmed portion may be prevented from being visible, which will be described in detail with reference to FIGS. 10 and 11 described below. Partial slimming means making a portion of a folding area of the glass 100 thinner than other areas. Partial slimming may be formed or provided to improve strength against stress due to repeated folding in the folding area of the glass 100.

The folding area of the glass 100 may be stepped to form the folding portion 170, and one surface of the glass 100 may be filled with the filler 110 to remove a step and planarize the display panel DP. As the filler 110 fills an area where a step is removed, the folding portion 170 extends to the planar portion 160 while having a slope due to the removed step, which may cause the boundary portion 190 to exist.

The filler 110 may be filled in one surface of the glass 100, including between the folding portion 170, the boundary portion 190, and the planar portion 160. When partially slimmed glass 100 and general glass 100 are configured together, a step difference may occur on the surface, and thus, a slimming portion may be visible. Partial slimming means making a portion of a folding area of the glass 100 thinner than other areas. Partial slimming may be formed or provided to improve strength against stress due to repeated folding in the folding area of the glass 100. To improve visibility of a slimming portion, the filler 110 may be filled in one surface of the glass 100 to planarize the other surface of the glass 100.

In an embodiment, the filler 110 may be a pressure-sensitive adhesive ("PSA"). In this case, adhesion strength may be affected by an amount of pressure applied to the surface. In an embodiment, the pressure-sensitive adhesive ("PSA") may include an elastomer such as acrylic resin, butyl rubber, ethylene-vinyl acetate ("EVA") resin, natural rubber, nitrile, silicone rubber, styrenic block copolymer ("SBC"), vinyl ether, etc. In an embodiment, the filler 110 may be an ultraviolet ("UV") curable adhesive (e.g., optically clear resin ("OCR")).

In a case where refractive indices of the filler 110 and the glass 100 match each other, when light is incident on the glass 100, interfacial reflection that occurs between the filler 110 and the glass 100 does not happen, and thus, a slimming portion may not be visible. When there is a difference in refractive indices of the filler 110 and the glass 100, a slimming portion may be visible. However, refractive indices of the filler 110 and the glass 100 may not be the same as each other due to the refractive index distribution for each product of the glass 100, the refractive index distribution of the material of the filler 110, the distribution due to the influence of the refractive index during the filling process (curing), etc., during the manufacturing process. Despite this limitation, when a difference between a refractive index of the filler 110 and a refractive index of the glass 100 is within about 0.07 under a predetermined condition (e.g., the inclination ΘR is less than about 1°), partial slimming may be prevented from being visible, which will be described in detail with reference to FIGS. 7 to 9 described below.

The polarization plate 130 may be disposed on a lower surface of the filler 110. The polarization plate 130 may be of a film type or a liquid crystal coating type. The film type may include a stretchable synthetic resin film, and the liquid crystal coating type may include liquid crystals arranged in a predetermined arrangement. Although not shown, the polarization plate 130 may further include a protection film. The polarization plate 130 may prevent light from the filler 110 from being reflected by hitting an electrode of the display panel DP and thus may allow a display screen to be easily seen.

Referring to FIG. 5, the folding portion 170 may have a uniform thickness in the first direction LD1. That is, the folding portion 170 may have a straight shape so that a thickness t1 of the folding area is constant. During repeated folding, when the thickness t1 of the folding area is not constant, folding performance may be degraded, such as being broken due to the concentration of stress on one relatively thicker area of the folding portion 170. Accordingly, when the thickness t1 of the folding area is constant, resistance of the folding portion 170 to the total stress applied during folding increases, and thus, folding characteristics may improve.

The inclination ΘR may be a smaller angle of two angles defined when the virtual line VL extending in the first direction LD1 and meeting the folding portion 170 meets the boundary portion 190. The first direction LD1 may be parallel to the planar portion 160. The virtual line VL extending in the first direction LD1 may be a line parallel to the planar portion 160. The inclination ΘR is a degree to which the planar portion 160 is inclined, and the inclination ΘR may be an acute angle (less than 180°). That is, the inclination ΘR may be an angle obtained by subtracting an angle defined when the boundary portion 190 and the planar portion 160 meet each other from 180°. The inclination ΘR may be less than about 1°. Thus, when incident light through the glass 100 meets the filler 110, and interfacial reflection occurs, an area of a partially slimmed portion may be prevented from being visible, which will be described in detail with reference to FIGS. 10 and 11 described below. Partial slimming means making a portion of a folding area of the glass 100 thinner than other areas. Partial slimming may be formed or provided to improve strength against stress due to repeated folding in the folding area of the glass 100.

In a case where refractive indices of the filler 110 and the glass 100 match each other, when light is incident on the glass 100, interfacial reflection that occurs between the filler 110 and the glass 100 does not happen, and thus, a slimming portion may not be visible. When there is a difference in refractive indices of the filler 110 and the glass 100, a slimming portion may be visible. However, refractive indices of the filler 110 and the glass 100 may not be the same as each other due to the refractive index distribution for each product of the glass 100, the refractive index distribution of the material of the filler 110, the distribution due to the influence of the refractive index during the filling process (curing), etc., during the manufacturing process. Despite this limitation, when a difference between a refractive index of the filler 110 and a refractive index of the glass 100 is within about 0.07 under a predetermined condition (e.g., the inclination ΘR is less than about 1°), partial slimming may be prevented from being visible, which will be described in detail with reference to FIGS. 7 to 9 described below.

Referring to FIG. 6, the folding portion 170 may be provided in one surface or both surfaces of the glass 100. Accordingly, the filler 110 may be filled in one surface or both surfaces of the glass 100. When the folding portion 170 is provided in both surfaces of the glass 100, depths of folding portions 170 may be the same as or different from each other. In this case, fillers 110 filled in both surfaces of the glass 100 may be different from each other.

When the folding portion 170 is provided in both surfaces of the glass 100, the inclination ΘR may be an angle different from sub-inclination ΘsR. In an embodiment, both of the inclination ΘR and the sub-inclination ΘsR may be less than about 1°. In an embodiment, at least one of the inclination ΘR and the sub-inclination ΘsR may be less than about 1°.

In a case where refractive indices of the filler 110 and the glass 100 match each other, when light is incident on the glass 100, interfacial reflection that occurs between the filler 110 and the glass 100 does not happen, and thus, a slimming portion may not be visible. When there is a difference in refractive indices of the filler 110 and the glass 100, a slimming portion may be visible. However, refractive indices of the filler 110 and the glass 100 may not be the same as each other due to the refractive index distribution for each product of the glass 100, the refractive index distribution of the material of the filler 110, the distribution due to the influence of the refractive index during the filling process (curing), etc., during the manufacturing process. Despite this limitation, when a difference between a refractive index of the filler 110 and a refractive index of the glass 100 is within about 0.07 under a predetermined condition (e.g., the inclination ΘR is less than about 1°), partial slimming may be prevented from being visible, which will be described in detail with reference to FIGS. 7 to 9 described below.

Figure 7:
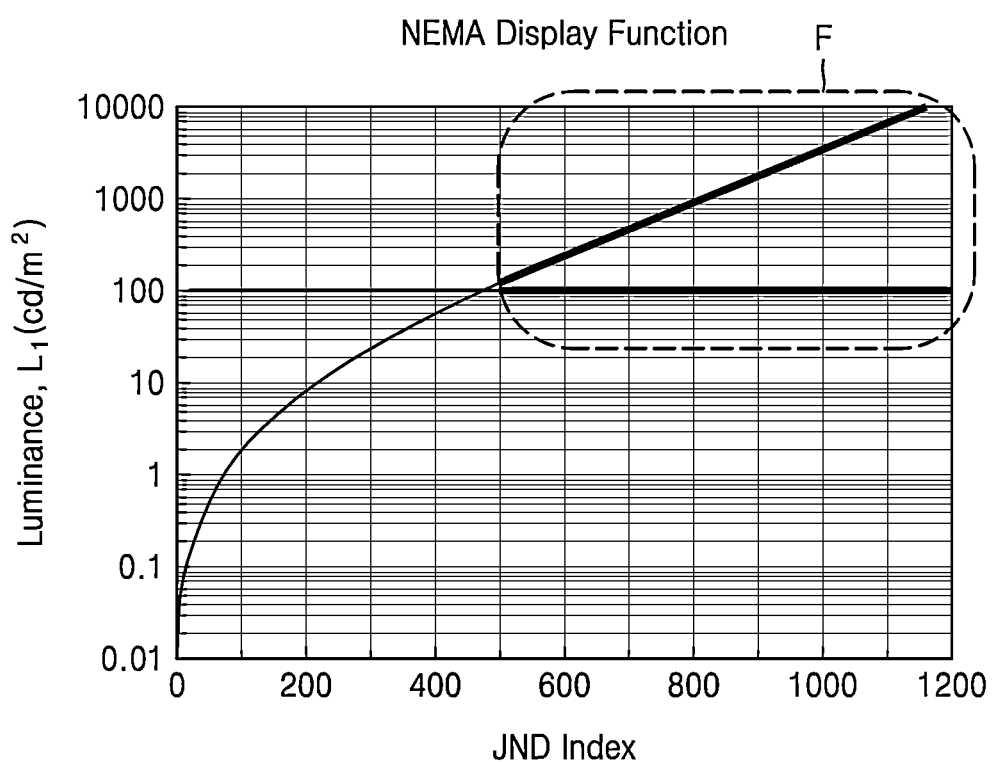
FIG. 7 is a graph showing luminance according to a just-noticeable difference.

FIG. 7 is a graph showing luminance according to a just-noticeable difference ("JND").

Referring to FIG. 7, interfacial reflectance with respect to surface reflection according to 1 JND, which is a smallest difference in stimulation that a person may feel, may be obtained. The JND index on the horizontal axis is a value obtained by dividing the JND by a predetermined section.

When an image by external reflected light is reflected on the surface, surface reflectance may be determined by a refractive index of the glass 100. When a refractive index of the glass 100 is about 1.5, surface reflection may have a minimum value of about 4%. When not only an image of surface reflection but also an image deformed by interfacial reflection is perceived by an observer, a shape of a slimming portion may be visible. The JND that most people may feel is Δ3JND. That is, Δ3JND is the JND that most people may not observe, meaning that it may be a smallest observable value.

In FIG. 7, it may be seen that as the JND increases, luminance also increases. Part F shows that in a section of 100 nit (candela per square meter (cd/m$^2$)) or greater, as the JND index increases, the log-scale luminance value linearly increases upwards to the right. Accordingly, in the section of 100 nit or greater of part F, 100 nit is for 500 JND and 1000 nit is for 800 JND, and thus, when a change in the JND has a value of Δk JND, a change in luminance has a value of $10^{2+1/300*k}$ nit. That is, when a change in the JND is Δ1JND, a change in luminance has a value of $10^{1/300}$ nit. This means that the luminance change for Δ1JND is 0.007, which has a value of about 0.7%, and thus, in the case of Δ3JND, the luminance may have a change of about 2%. When reflectance is within about 2% of surface reflectance at an interface where the glass 100 and the filler 110 meet each other, that is, when interfacial reflectance is within about 0.08%, which is within about 2% of surface reflectance about 4%, interfacial reflection may not be visible. Accordingly, when interfacial reflectance is within about 0.08%, a slimming portion may not be visible.

Figure 8A:
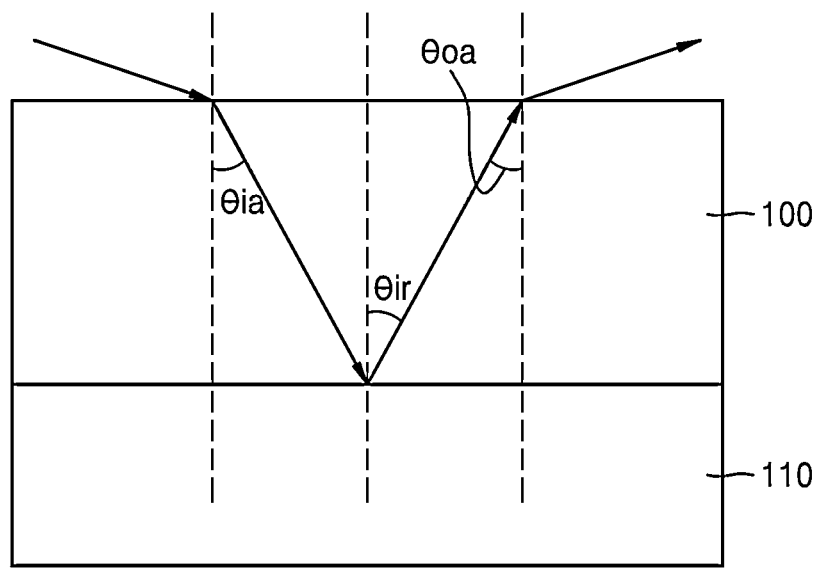
FIGS. 8A and 8B are cross-sectional views showing angles of light passing through and reflected by glass and a filler.
Figure 8B:
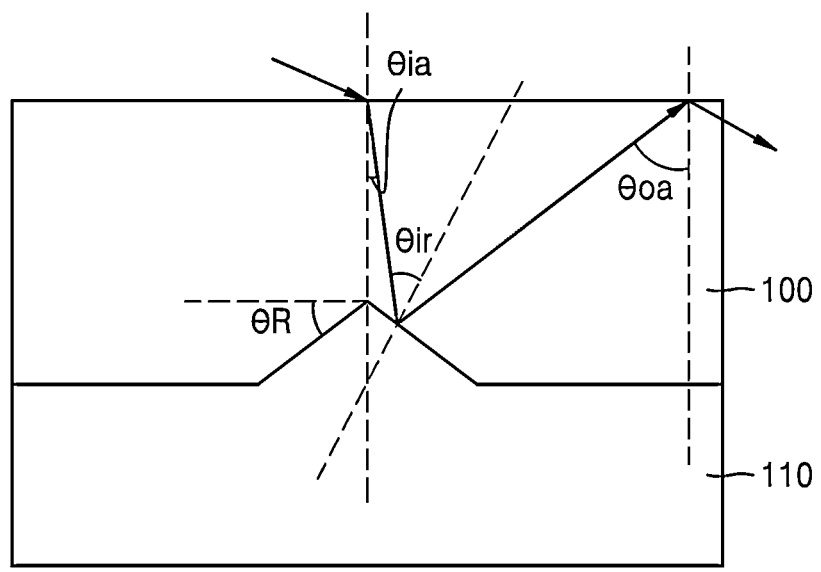

FIGS. 8A and 8B are cross-sectional views showing angles of light passing through and reflected by the glass 100 and the filler 110.

FIG. 8A is a cross-sectional view showing angles of light passing through and reflected by the glass 100 and the filler 110 when there is no inclination angle of an interface. That is, FIG. 8A is a cross-sectional view showing a case where the inclination ΘR of the folding portion 170 is 0°. An angle Θia may be an angle of light entering the inside of the glass 100. An angle Θir may be an incidence angle at an interface where the glass 100 and the filler 110 meet each other. An angle Θoa may be an angle defined by interfacially reflected light with a normal of a surface. Referring to FIG. 8A, when the inclination ΘR is 0°, the angle Θia and the angle Θir may be the same as each other. In addition, the angle Θir may be the same as the angle Θoa.

FIG. 8B is a cross-sectional view showing angles of light passing through and reflected by the glass 100 and the filler 110 when there is an inclination angle of an interface. That is, FIG. 8B is a cross-sectional view showing a case where the inclination ΘR of the folding portion 170 is greater than 0°. When the inclination ΘR increases, the angle Θia may be different from the angle Θir, and the angle Θir may be greater than the angle Θia due to the inclination ΘR. In this case, the angle Θir may be a value obtained by adding the angle Θia and the inclination ΘR. When the angle Θir increases due to the inclination ΘR, the angle Θoa may be a value obtained by adding the angle Θia and twice the inclination ΘR. Accordingly, because the angle Θoa may be greater than a critical angle, the interfacially reflected light is totally reflected and may not go out to the outside the glass 100, and thus, a shape of the interface may not be visible. In this regard, the angle Θir may be less than the critical angle, and thus, a maximum Fresnel reflectance at the interface may be a reflectance at the critical angle.

Figure 9A:
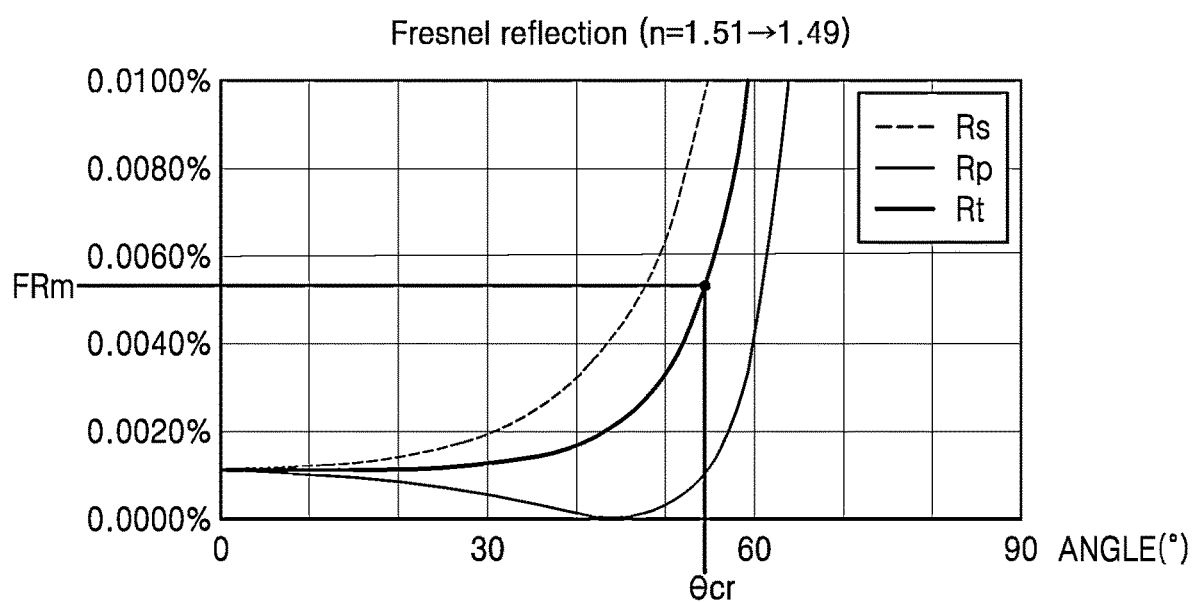
FIG. 9A is a graph showing reflectance according to a critical angle.
Figure 9B:
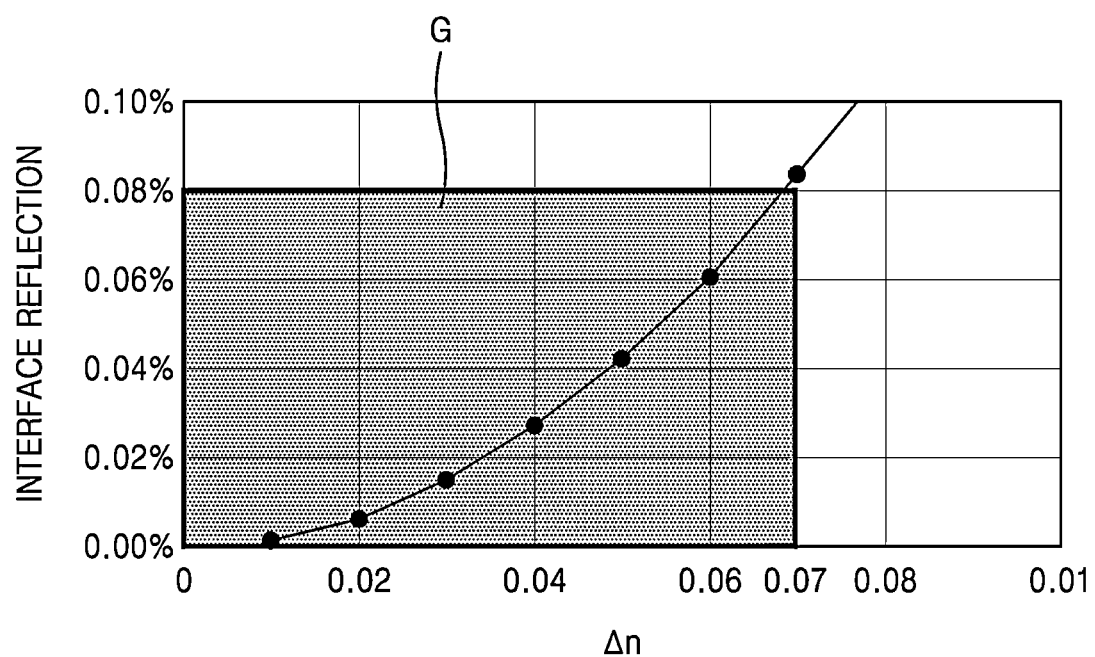
FIG. 9B is a graph showing interfacial reflectance according to a difference in refractive index.

FIGS. 9A and 9B are a graph showing reflectance according to a critical angle Θcr and a graph showing interfacial reflectance according to a refractive index difference Δn, respectively.

Referring to FIG. 9A, reflectance may be confirmed when a refractive index of the glass 100 is about 1.51 and a refractive index of the filler 110 is about 1.49. That is, FIG. 9A is a graph showing a maximum reflectance FRm when the refractive index difference Δn is about 0.02. A total reflectance Rt may be a value obtained by adding an s-wave reflectance Rs and a p-wave reflectance Rp to each other. The maximum reflectance FRm may be obtained by obtaining the total reflectance Rt corresponding to the angle Θir. As described above, the angle Θir may not be greater than the critical angle Θcr, and accordingly, the maximum reflectance FRm at an interface may be a reflectance at the critical angle Θcr. When light reflected from the filler 110 is incident on the glass 100, the critical angle Θcr may be about 41.3°.

Referring to FIG. 9B, the maximum reflectance FRm may be confirmed according to the refractive index difference Δn. As described above, when the maximum reflectance FRm is about 0.08% or less, a slimming portion may not be visible. Accordingly, it may be confirmed in FIG. 9B that the refractive index difference Δn in part G, which is a region where interfacial reflectance is about 0.08% or less, is about 0.07 or less. That is, when the filler 110 having the refractive index of part G of FIG. 9B is used, a slimming portion may not be visible. In an embodiment, in a visible light spectrum (e.g., about 400 nanometer (nm) to about 700 nm), a refractive index of the glass 100 may be about 1.516, and thus, a difference in refractive index between the glass 100 and the filler 110 may be within about 0.07.

Figure 10A:
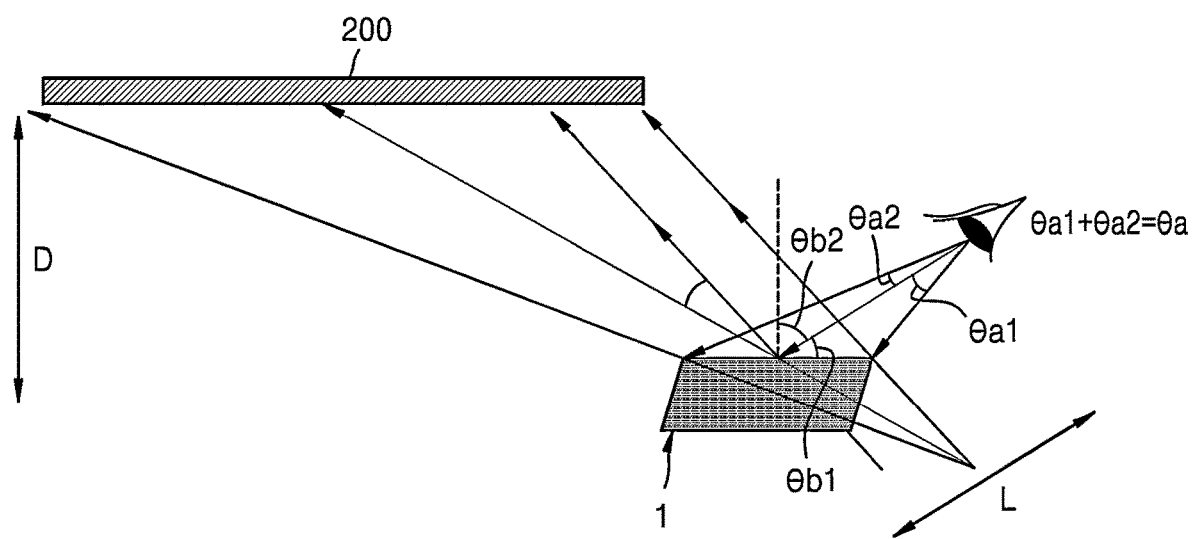
FIG. 10A is a perspective view showing a viewing angle area by interfacial reflection according to a viewing angle.

FIGS. 10A to 10C are respectively a perspective view showing a viewing angle area 200 by interfacial reflection according to a viewing angle Θa and tables showing a first viewing angle Θa1 and a second viewing angle Θa2 according to a screen angle Θb and a viewing distance L.

Referring to FIG. 10A, a first screen angle Θb1 may be a smaller angle of two angles defined by a meeting of a virtual line vertical to the display device 1 and a virtual line connecting a center of the display device 1 from a viewer when the viewer looks at the display device 1. A second screen angle Θb2 may be an angle obtained by subtracting the first screen angle Θb1 from 90°. That is, the second screen angle Θb2 may be an angle at which the viewer looks at the center of the display device 1. As the display device 1 serves as a mirror when not driven, the viewing angle area 200 may be an area reflected when the viewer looks at the display device 1.

The viewing angle Θa may be an overall angle at which the viewer looks at the display device 1. That is, the viewing angle Θa may be an angle defined when virtual lines connecting a closest edge and a furthest edge of the display device 1 from the viewer meet each other. The first viewing angle Θa1 may be an angle defined when virtual lines connecting the closest edge of the display device 1 and the center of the display device 1 from the viewer meet each other. The second viewing angle Θa2 may be an angle defined when virtual lines connecting the center of the display device 1 and the furthest edge of the display device 1 from the viewer meet each other. The viewing angle Θa may be an angle obtained by adding the first viewing angle Θa1 and the second viewing angle Θa2 to each other. The first viewing angle Θa1 may be greater than the second viewing angle Θa2.

A path change angle ΔΘ may be an angle obtained by subtracting the first viewing angle Θa1 from an angle at which light incident on the glass 100 defines a normal of the glass 100 with light finally coming out through the glass 100 again. When the path change angle ΔΘ is less than the first viewing angle Θa1, interfacially reflected light may not deviate from the viewing angle area 200. That is, when the path change angle ΔΘ is less than the first viewing angle Θa1, a slimming portion may not be visible. In a case where the path change angle ΔΘ is greater than the first viewing angle Θa1, when a vertical distance D from the display device 1 to the viewing angle area 200 increases, interfacially reflected light may deviate from the viewing angle area 200, and thus, a slimming portion may be visible.

The first viewing angle Θa1 may be greater than the second viewing angle Θa2, but when the viewing distance L is long, and the first screen angle Θb1 increases, the first viewing angle Θa1 may be similar to the second viewing angle Θa2. Referring to FIG. 10B, as the viewing distance L and the first screen angle Θb1 increase, the first viewing angle Θa1 may decrease. Referring to FIG. 10C, as the viewing distance L and the first screen angle Θb1 increase, the second viewing angle Θa2 may decrease. However, regarding each interval of the first viewing angle Θa1 and the second viewing angle Θa2 decreasing as the viewing distance L and the first screen angle Θb1 increase, the decreasing interval of the first viewing angle Θa1 may be greater. Thus, as the viewing distance L and the first screen angle Θb1 increase, the first viewing angle Θa1 and the second viewing angle Θa2 may be similar to each other.

When the first viewing angle Θa1 and the second viewing angle Θa2 are similar to each other, each of the first viewing angle Θa1 and the second viewing angle Θa2 may be half of the viewing angle Θa because a value obtained by adding the first viewing angle Θa1 and the second viewing angle Θa2 to each other is the viewing angle Θa. That is, when the first viewing angle Θa1 and the second viewing angle Θa2 are similar to each other, the first viewing angle Θa1 may be ½ viewing angle Θa, and the second viewing angle Θa2 may also be ½ viewing angle Θa. In this case, because a slimming portion is not visible when the path change angle ΔΘ is less than the first viewing angle Θa1, a slimming portion may not be visible when the path change angle ΔΘ is less than half of the viewing angle Θa.

Figure 11A:
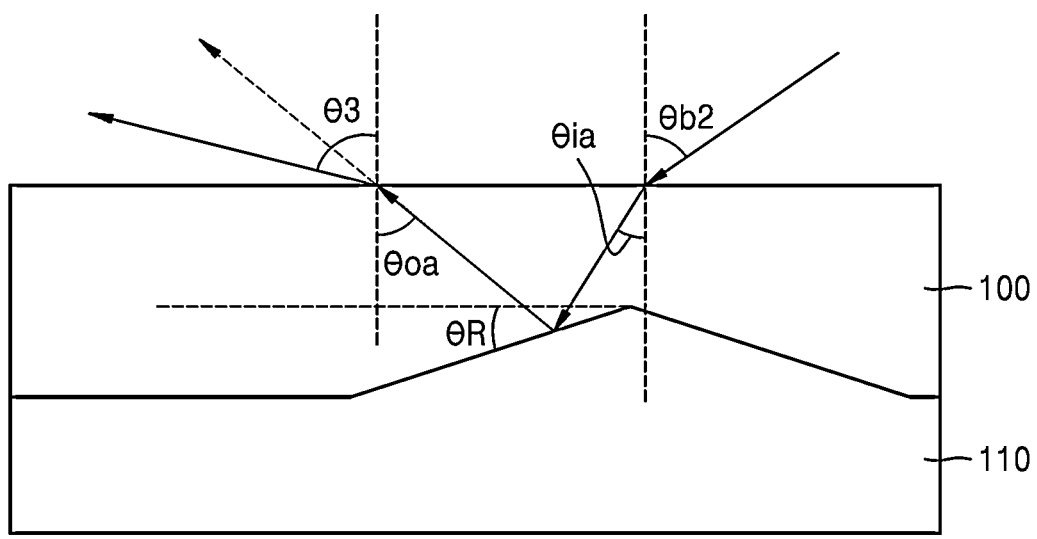
FIG. 11A is a cross-sectional view showing a path change angle according to a screen angle.

FIGS. 11A to 11C are a cross-sectional view showing the path change angle ΔΘ according to the second screen angle Θb2, a table showing the path change angle ΔΘ according to the inclination ΘR and the second screen angle Θb2, and a table showing the path change angle ΔΘ according to the viewing distance L and the second screen angle Θb2, respectively.

Referring to FIG. 11A, incident light according to the second screen angle Θb2 may be refracted to be incident at the angle Θia inside the glass 100. Light having the angle Θia may be reflected from the filler 110 having an inclination angle of the inclination ΘR and be incident at the angle Θoa toward the glass 100. When light having the angle Goa exits from the glass 100 having a different refractive index to the atmosphere, the light may be refracted again to travel at a third angle Θ3. The third angle Θ3 may be an angle obtained by adding the second screen angle Θb2 and the path change angle ΔΘ to each other. That is, the path change angle ΔΘ may be an angle obtained by subtracting the second screen angle Θb2 from the third angle Θ3.

Referring to FIG. 11B, as the second screen angle Θb2 and the inclination ΘR increase, the path change angle ΔΘ, which is a value in the table, may increase. Referring to FIG. 11C, as the second screen angle Θb2 and the inclination ΘR increase, half of the viewing angle Θa, which is a value in the table, may decrease. In general, when a viewer looks at the display device 1, a case where the second screen angle Θb2 is greater than about 60° and the viewing distance L is greater than about 500 millimeters (mm) is extremely rare. Accordingly, when it is assumed as viewing conditions that the second screen angle Θb2 is about 60° or less and the viewing distance L is 500 mm or less, the path change angle ΔΘ and half of the viewing angle Θa each are about 4.7°, and thus, a slimming portion may not be visible in region H of FIG. 11B and region J of FIG. 11C where the path change angle ΔΘ is less than or equal to half of the viewing angle Θa. Accordingly, when the inclination ΘR is less than about 1°, a slimming portion of the folding portion 170 may not be visible.

According to one or more of the above embodiments, a cover window and a display device having the same may have partial slimming visibility improved by adjusting an angle of a partial slimming shape and a refractive index of a filler. However, the invention is not limited by such an effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A cover window comprising:
    glass comprising a folding portion of a folding area, a planar portion, and a boundary portion between the folding portion and the planar portion, the boundary portion having a thickness which gradually becomes greater than a thickness of the folding portion as farther from the folding portion and having inclination with respect to the planar portion; and
    a filler disposed on a first surface of the glass,
    wherein the inclination is an acute angle defined when a virtual line which is parallel to the planar portion and meets the folding portion meets the boundary portion, and is less than 1°, and
    wherein a difference between a refractive index of the filler and a refractive index of the glass is within about 0.07.

2. The cover window of claim 1, wherein surface reflection occurs due to light incident on a second surface of the glass opposite to the first surface of the glass,
    wherein interfacial reflection occurs at a portion where the glass and a surface of the filler facing the glass meet each other,
    wherein the filler has the refractive index at which the interfacial reflection is within about 2% of the surface reflection.

3. The cover window of claim 1, further comprising a polarization plate on a first surface of the filler opposite to a second surface of the filler facing the glass,
    wherein the filler comprises a pressure-sensitive adhesive.

4. The cover window of claim 3, wherein the glass comprises ultra-thin glass and has the refractive index of about 1.5 to about 1.52.

5. The cover window of claim 1, further comprising a polarization plate on a first surface of the filler opposite to a second surface of the filler facing the glass,
    wherein the filler comprises an ultraviolet curable adhesive.

6. The cover window of claim 5, wherein the glass comprises ultra-thin glass and has the refractive index of about 1.5 to about 1.52.

7. The cover window of claim 1, wherein the folding portion, the boundary portion, and the planar portion are symmetrical with respect to a center of the folding portion.

8. The cover window of claim 1, wherein the folding portion has a uniform thickness.

9. The cover window of claim 1, wherein the glass further includes a second surface opposite to the first surface of the glass, and
    wherein the folding portion is provided in at least one of the first and second surfaces of the glass.

10. The cover window of claim 9, wherein the filler disposed on at least one of the first and second surfaces of the folding portion of the glass comprises a same material.

11. A display device comprising:
    a lower cover;
    a display panel disposed on the lower cover; and
    a cover window disposed on the display panel and comprising glass and a filler, wherein the glass comprises a folding portion of a folding area, a planar portion, and a boundary portion between the folding portion and the planar portion, the boundary portion having a thickness which gradually becomes greater than a thickness of the folding portion as farther from the folding portion and having inclination with respect to the planar portion, and the filler is filled between the planar portion, the folding portion, and the boundary portion and in a first surface of the glass, wherein the boundary portion has the folding portion gradually thickening therefrom and has the inclination, wherein the inclination is an acute angle defined when a virtual line which is parallel to the planar portion and meets the folding portion meets the boundary portion, and is less than, and wherein a difference between a refractive index of the filler and a refractive index of the glass is within about 0.07.

12. The display device of claim 11, wherein the glass further includes a second surface opposite to the first surface of the glass, wherein surface reflection occurs due to light incident on the second surface of the glass, wherein interfacial reflection occurs at a portion where the glass and a surface of the filler meet each other, wherein the filler has the refractive index at which the interfacial reflection is within about 2% of the surface reflection.

13. The display device of claim 11, wherein the cover window further comprises a polarization plate on a first surface of the filler opposite to a second surface of the filler facing the glass, wherein the filler comprises a pressure-sensitive adhesive.

14. The display device of claim 13, wherein the glass comprises ultra-thin glass and has the refractive index of about 1.5 to about 1.52.

15. The display device of claim 11, wherein the cover window further comprises a polarization plate on a first surface of the filler opposite to a second surface of the filler facing the glass, wherein the filler comprises an ultraviolet curable adhesive.

16. The display device of claim 15, wherein the glass comprises ultra-thin glass and has the refractive index of about 1.5 to about 1.52.

17. The display device of claim 11, wherein the folding portion, the boundary portion, and the planar portion are symmetrical with respect to a center of the folding portion.

18. The display device of claim 11, wherein the folding portion has a uniform thickness.

19. The display device of claim 11, wherein the glass further includes a second surface opposite to the first surface of the glass, and wherein the folding portion is provided at least one of the first and second surfaces of the glass.

20. The display device of claim 19, wherein the filler disposed on at least one of the first and second surfaces of the glass corresponding to the folding portion comprises a same material.

* * * * *